United States Patent [19]
Lee

[11] Patent Number: 5,951,149
[45] Date of Patent: Sep. 14, 1999

[54] LASER GENERATING APPARATUS

[75] Inventor: Roger Lee, Taipei, Taiwan

[73] Assignee: Simpatico Industries Co., Ltd., Taipei, Taiwan

[21] Appl. No.: 08/995,984

[22] Filed: Dec. 22, 1997

[51] Int. Cl.⁶ ................................................ B43K 29/10
[52] U.S. Cl. .................... 362/259; 362/280; 362/205; 362/319; 362/806
[58] Field of Search ................................ 362/259, 319, 362/277, 280, 281, 202, 205, 321, 322, 806

[56] References Cited

U.S. PATENT DOCUMENTS

| | | | |
|---|---|---|---|
| 1,600,067 | 9/1926 | Retze | 362/319 |
| 2,231,719 | 2/1941 | Hughey | 362/319 |
| 4,335,347 | 6/1982 | Guthrie | 362/280 |
| 5,268,829 | 12/1993 | Lo | 362/259 |
| 5,307,253 | 4/1994 | Jehn | 362/259 |

*Primary Examiner*—Thomas M. Sember
*Attorney, Agent, or Firm*—Bacon & Thomas, PLLC

[57] ABSTRACT

A laser generating apparatus which includes a laser holder holding a plurality of lenses decorated with different designs, the laser holder being turned with a rotary cap on one end of a barrel, which is mounted within a casing and holds a laser module, and set into one of a series of positions for permitting one particular lens to be retained in alignment with a laser firing hole on the laser module for producing a particular pattern of light spot.

5 Claims, 2 Drawing Sheets

LASER GENERATING APPARATUS

BACKGROUND OF THE INVENTION

The present invention relates to a laser generating apparatus controlled to emit a laser beam for pointing things out on a map, blackboard, etc., and more particularly to such a laser generating apparatus that can be controlled to produce different patterns of light spot.

A variety of laser generating apparatus have been developed for use in for example pointing things out on a map, blackboard, etc., and have appeared on the market. These laser generating apparatus are commonly comprised of a casing having a lens in a front hole, a battery power supply mounted inside the casing, and a laser module mounted inside the casing and connected to the battery power supply, and an on/off switch controlled to trigger the laser module, causing it to emit a laser beam out of the casing through the lens on the front hole of the casing. These laser generating apparatus can only produce a fixed pattern of light spot.

SUMMARY OF THE INVENTION

According to one aspect of the present invention, the laser generating apparatus comprises a laser holder holding a plurality of lenses decorated with different designs, the laser holder being turned with a rotary cap on one end of a barrel, which is mounted within a casing and holds a laser module, and set into one of a series of positions for permitting one particular lens to be retained in alignment with a laser firing hole on the laser module for producing a particular pattern of light spot. According to another aspect of the present invention a round head bit is supported on a spring in a radial hole on the barrel and forced by the spring into engagement with the inside wall of the rotary cap to provide a friction resistance to the rotary cap during the rotary motion of the rotary cap, so that the rotary cap can be firmly retained in position after each turning operation.

DETAILED DESCRIPTION OF THE PREFERRED EMBODIMENT

Figure 1:
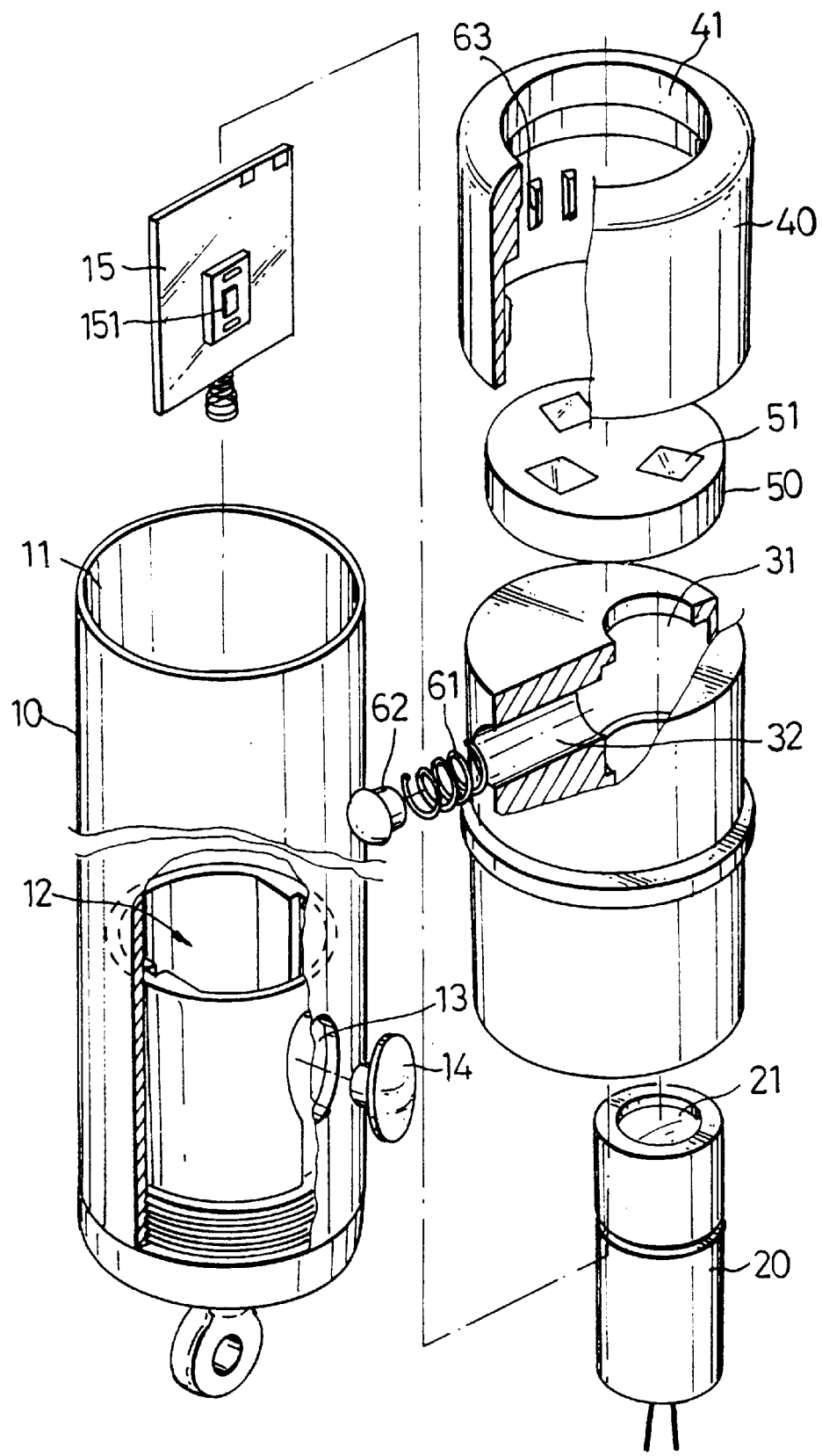
FIG. 1 is an exploded view of a laser generating apparatus according to the present invention.
Figure 2:
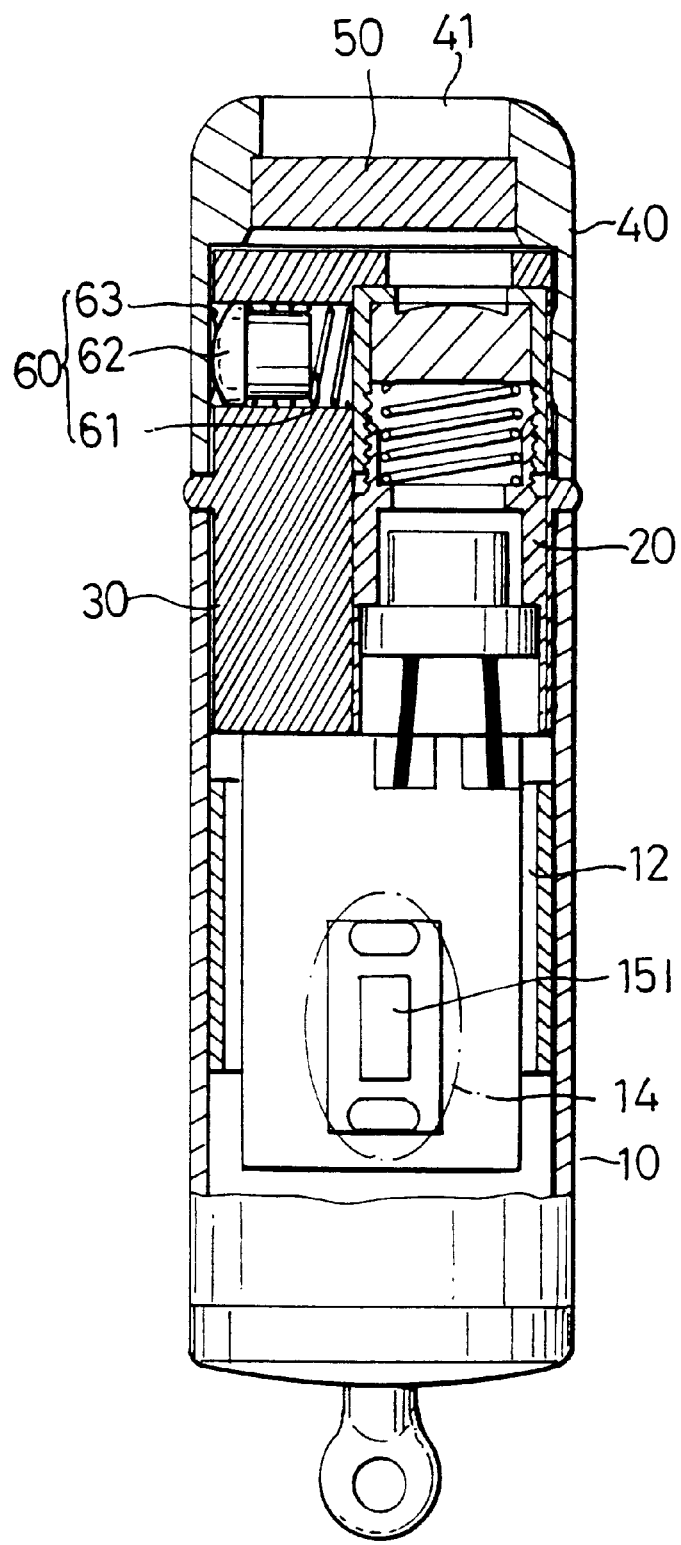
FIG. 2 is a sectional assembly view of the laser generating apparatus shown in FIG. 1.

Referring to FIGS. 1 and 2, a laser generating apparatus in accordance with the present invention is generally comprised of a casing 10, a laser module 20, a barrel 30, a rotary cap 40, a lens holder 50, and a locating device 60.

The casing 10 can have any of a variety of shapes, for example, a cylindrical shape. The casing 10 comprises a front opening 11, a battery chamber 12 at the rear end remote from the front opening 11 which holds a battery set (not shown), a radial through hole 13 disposed in communication with the battery chamber 12, a circuit board 15 mounted in the battery chamber 12 and connected to the battery set by an electric wire, the circuit board 15 having an on/off switch 151 disposed in alignment with the radial through hole 13, a press button 14 mounted in the radial through hole 13 and controlled to switch on/off the on/off switch 151.

The barrel 30 is mounted in the front opening 11 of the casing 10 and partially projecting out of the casing 10, having a longitudinal through hole 31 spaced from the longitudinal central axis.

The laser module 20 is mounted in the longitudinal through hole 31 on the barrel 30 and connected to the circuit board 15 by an electric wire, having a laser firing hole 21 through which a laser beam is emitted from the laser diode thereof (the laser generating circuit of the laser module 20 is of the known art and not within the scope of the present invention, therefore it is not described herein in detail). When the press button 14 is depressed to switch on the on/off switch 151, the laser module 20 is triggered to emit a laser beam through the laser firing hole 21.

The rotary cap 40 is covered on one end of the barrel 30 outside the casing 10, having an axial opening 41.

The lens holder 50 is mounted inside the axial opening 41 in front of the barrel 30, having a plurality of lenses 51 decorated with different designs.

The locating device 60 is mounted between the barrel 30 and the rotary cap 40, comprised of a spring 61 mounted in a radial hole 32 on the barrel 30, and a round head bit 62 supported on the spring 61 and forced by the spring 61 into engagement with spaces between ribs 63 on the inside wall of the rotary cap 40.

Referring to FIG. 2 again, when the rotary cap 40 is rotated on barrel 30, the ribs 63 are moved over the round head bit 62 one after another, and the lenses 51 are alternatively moved over the longitudinal through hole 31 on the barrel 30. When one rib 63 passes over the round head bit 62, a sound is produced. When one lens 51 is moved into alignment with the longitudinal through hole 31 on the barrel 30, the round head bit 62 is forced into the space between two ribs 63 to hold the rotary cap 40 in position. When the press button 14 is depressed to switch on the on/off switch 151, the laser module 20 is triggered to emit a laser beam out of the laser firing hole 21, permitting the laser beam to pass through the longitudinal through hole 31 on the barrel 30 and one lens 51 on the lens holder 50. Therefore, a particular pattern of light spot is projected onto the target.

While only one embodiment of the present invention has been shown and described, it will be understood that various modifications and changes could be made thereunto without departing from the spirit and scope of the invention disclosed.

What the invention claimed is:

1. A laser generating apparatus comprising:

a casing having a front opening;

a barrel having a first end mounted in the front opening on said casing, a second end extended out of said casing, and a longitudinal through hole spaced from the longitudinal central axis;

a laser module mounted in the longitudinal through hole on said barrel and controlled to emit a laser beam out of a front laser firing hole thereof;

a rotary cap covered on the second end of said barrel, said rotary cap having an axial opening through which the laser beam from said laser module passes out of said rotary cap;

a lens holder fixedly mounted inside the axial opening on said rotary cap and holding a plurality of lenses, said lens holder being turned with said rotary cap on the second end of said barrel, permitting one of said lenses to be set into alignment with the laser firing hole on said laser module; and a locating device mounted between said barrel and said rotary cap, said locating device providing a friction resistance to said rotary cap, causing said rotary cap to be retained in position after each turning operation.

2. The laser generating apparatus of claim 1 further comprising a circuit board mounted inside said casing and connected to said laser module by an electric wire, an on/off switch mounted on said circuit board and controlled to turn on/off said laser module, a press button mounted in a radial through hole on said casing and controlled to switch on/off said on/off switch.

3. The laser generating apparatus of claim 1, wherein the lenses on said lens holder are decorated with a respective design.

4. The laser generating apparatus of claim 3, wherein the design on said lenses is a letter.

5. The laser generating apparatus of claim 1, wherein said locating device comprises a spring mounted in a radial hole on said barrel, and a round head bit supported on said spring and forced by said spring into engagement with spaces between ribs on an inside wall of said rotary cap.

* * * * *